(12) United States Patent
Lee et al.

(10) Patent No.: US 11,489,014 B2
(45) Date of Patent: Nov. 1, 2022

(54) MONOLITHIC SOLAR CELL

(71) Applicant: KOREA INSTITUTE OF SCIENCE AND TECHNOLOGY, Seoul (KR)

(72) Inventors: Doh Kwon Lee, Seoul (KR); Yoon Hee Jang, Seoul (KR); In Ho Kim, Seoul (KR); Hee Sun Yun, Gunpo-si (KR); Jeung Hyun Jeong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 426 days.

(21) Appl. No.: 16/320,932

(22) PCT Filed: Nov. 27, 2017

(86) PCT No.: PCT/KR2017/013584
§ 371 (c)(1),
(2) Date: Jan. 25, 2019

(87) PCT Pub. No.: WO2019/103207
PCT Pub. Date: May 31, 2019

(65) Prior Publication Data
US 2020/0343309 A1    Oct. 29, 2020

(30) Foreign Application Priority Data
Nov. 22, 2017   (KR) .......................... 10-2017-0156540

(51) Int. Cl.
*H01L 27/30*    (2006.01)
*H01G 9/20*     (2006.01)
(Continued)

(52) U.S. Cl.
CPC ......... *H01L 27/302* (2013.01); *H01G 9/2059* (2013.01); *H01L 27/286* (2013.01);
(Continued)

(58) Field of Classification Search
CPC ................. H01L 27/302; H01L 27/286; H01L 31/022475; H01L 31/022483;
(Continued)

(56) References Cited

U.S. PATENT DOCUMENTS

2017/0092697 A1    3/2017  Chang et al.
2017/0287648 A1*  10/2017  Wu .................... H01L 51/0003
2018/0019360 A1*   1/2018  Mishima .............. H01L 27/301

FOREIGN PATENT DOCUMENTS

KR   10-2017-0049359 A    5/2017
WO   WO 2016/157979 A1   10/2016
(Continued)

OTHER PUBLICATIONS

Brinkmann, Suppressed decomposition of organometal halide perovskites by impermeable electron-extraction layers in inverted solar cells, Nature Communications | 8:13938 | DOI: 10.1038/ncomms13938 | www.nature.com/naturecommunications, pp. 1-9 (Year: 2017).*

(Continued)

*Primary Examiner* — Devina Pillay
(74) *Attorney, Agent, or Firm* — Rabin & Berdo, P.C.

(57) ABSTRACT

A monolithic solar cell includes a first solar cell that is a sequential stack of an electrode, a silicon substrate, and an n-type emitter layer; a recombination layer disposed on the n-type emitter layer; an interfacial layer that is a double layer constituted of PEDOT:PSS and poly-TPD or PEDOT:PSS and PCDTBT, and that is disposed on the recombination layer; and a second solar cell that includes a p-type hole selective layer and a perovskite layer disposed on the p-type hole selective layer, the a p-type hole selective layer contacting and being integrated onto the interfacial layer of the first solar cell in a heat treatment during which the interfacial layer is partially decomposed, wherein the presence of the interfacial layer prevents a reduction in photoelectric con- (Continued)

version efficiency that occurs if the first solar cell and the second solar cell are combined without the presence of the interfacial layer.

6 Claims, 8 Drawing Sheets

(51) Int. Cl.
*H01L 27/28* (2006.01)
*H01L 31/0687* (2012.01)
*H01L 51/42* (2006.01)
*H01L 31/0224* (2006.01)

(52) U.S. Cl.
CPC .............. *H01L 31/022475* (2013.01); *H01L 31/022483* (2013.01); *H01L 31/0687* (2013.01); *H01L 51/4226* (2013.01); *H01L 51/4233* (2013.01)

(58) Field of Classification Search
CPC . H01L 31/0687; H01L 31/043; H01L 31/046; H01L 31/0504; H01L 31/0725; H01L 31/18; H01L 31/032; H01L 51/4226; H01L 51/4233; H01L 51/4213; H01L 51/0037; Y02E 10/549; Y02E 10/542; H01G 9/2059; Y02P 70/50
See application file for complete search history.

(56) References Cited

FOREIGN PATENT DOCUMENTS

| WO | WO 2016/158838 A1 | 10/2016 |
| WO | WO 2016-198898 A1 | 12/2016 |
| WO | WO 2017-190810 A1 | 11/2017 |

OTHER PUBLICATIONS

Liu, Enhance the Light Extraction Efficiency of QLED with Surface Micro-Nanostructure Journal of Nanomaterials, vol. 2020, Article ID 8858996, 11 pages, pp. 1-11 (Year: 2020).*

Malinkiewicz, Perovskite solar cells employing organic charge-transport layers, Nature Photonics, vol. 8, Feb. 2014, pp. 128-132 (Year: 2014).*

Jérémie Werner et al., "Efficient Monolithic Perovskite/Silicon Tandem Solar Cell with Cell Area > 1 cm2", The Journal of Physical Chemistry Letters, 2016, pp. 161-166, vol. 7.

* cited by examiner

MONOLITHIC SOLAR CELL

TECHNICAL FIELD

The present invention relates to a technology of tandem integration of perovskite solar cell onto a silicon solar cell, and more particularly, to a monolithic solar cell, on which a silicon solar cell and a perovskite solar cell are stacked in series, including an interfacial layer (organic sacrificial layer) capable of improving charge transfer or recombination at an interface between the two cells and a method of manufacturing the monolithic solar cell.

BACKGROUND ART

As the depletion of fossil reserves and the global warming phenomenon become more and more widespread, interest in solar energy, which is an environmentally friendly and infinite energy source, is increasing. Photovoltaic energy can be utilized as a distributed power source in areas where external power supply is difficult as well as large-scale power generation because it has few geographical constraints and is safe in terms of utilization. In recent years, demand for photovoltaic energy technology is expected to increase sharply in line with the trend toward $CO_2$ reduction under a new climate convention. The European Commission for Renewable Energy estimates that about 25% of global electricity demand by 2040 and about 70% of global electricity demand by 2070 will be met by solar energy.

As a representative example of a solar cell collecting electrons generated by receiving sunlight to generate electricity, there is a silicon solar cell manufactured by joining two semiconductors respectively having p-type and n-type semiconducting properties to each other such that electrons/holes generated by receiving light energy are spontaneously separated/collected in a space charge region around a p-n junction.

Depending on the materials of semiconductor light absorbing layer, solar cells can be classified into a silicon solar cell, a compound thin-film solar cell, and an organic or hybrid solar cell. Thereamong, a crystalline silicon solar cell, which is manufactured using a silicon wafer, has already been commercialized, accounts for more than 90% of the global solar cell market, and a utilization range thereof is ever increasing. A compound thin-film solar cell is manufactured by forming a semiconducting compound thin-film on a glass or metal substrate, instead of a silicon wafer, by vacuum or non-vacuum processes. While for the production of a silicon solar cell, ingot, wafer, cell and module manufacturing companies are involved in a separate manner, a thin-film solar cell has advantages in reducing manufacturing costs because cells and modules can be manufactured in a batch process due to the development of thin-film process technology.

However, the theoretical photoelectric conversion efficiency (hereinafter referred to as efficiency) of a single-junction solar cell is limited to a maximum of about 33% (Shockley-Queisser limit) because surplus energy of electrons-holes generated due to the absorption of photons having energy larger than a band gap by the semiconductor is inevitably lost as heat (thermalization loss), whereas photons having energy lower than the band gap pass through the semiconductor without being absorbed thereby.

Tandem solar cells have been proposed to overcome the efficiency limit of a single-junction solar cell. A tandem solar cell is manufactured by vertically stacking light absorption layers with different bandgaps to minimize the thermalization loss by effectively utilizing the photon energy in a wide wavelength range. In particular, a tandem solar cell has a structure wherein a solar cell with a large bandgap is formed on an upper part where sunlight is first absorbed, and then a solar cell with a smaller bandgap is formed under the upper part. By constituting a tandem solar cell in this manner such that photons with high energy (short wavelength) are absorbed by an upper part and photons with relatively small energy (long wavelength) are absorbed by a lower part, first, sunlight in a wider wavelength range, compared to a single-junction solar cell, can be effectively utilized and, second, thermalization loss of photon energy can be minimized by allowing light absorbing layers having different band gaps to separately absorb sunlight according to the wavelength region.

As constituents of a tandem solar cell, group III-V compound semiconductors and amorphous/polycrystalline silicon (a-Si/m-Si) have been the most widely used. With regard to group III-V compound-based tandem solar cells, the Fraunhofer Institute reported a quadruple junction solar cell with a photoelectric conversion efficiency of 46.0% in 2014. However, group III-V compound-based tandem solar cells are used in extremely limited fields such as a spacecraft due to the complexity of the epitaxial deposition technique used in manufacture thereof and high manufacturing costs due to the use of expensive equipment. On the other hand, with regard to amorphous/polycrystalline silicon tandem solar cells having relatively high price competitiveness, LG Electronics reported a triple junction solar cell with an efficiency of 13.4% in 2012, but the efficiency is still too low to allow commercialization.

Recently, a perovskite solar cell capable of achieving excellent performance, such as a photoelectric conversion efficiency of 22% or more, by a low-cost solution process has rapidly received attention, and attention is paid to the possibility of band gap control of this material. Thus, attempts to apply a perovskite solar cell to a tandem architecture are under intense competition around the world. In theory, double junction tandem solar cells have been known to achieve an efficiency of up to 46% when an upper cell has a band gap of 1.6 to 1.7 eV and a lower cell has a band gap of 1.0 to 1.1 eV. A perovskite solar cell exhibits the best photoelectric characteristics among solar cells with a bandgap suitable for an upper cell of a double junction tandem solar cell, so that if it can be successfully tandemized with a silicon solar cell which dominates the market to date, the efficiency limit of a silicon solar cell can be overcome without a significant increase in the manufacturing costs of a single junction silicon solar cell, which can evoke major changes in the existing market.

Tandem solar cells can be classified into a mechanical tandem cell, manufactured by vertically stacking completed single junction solar cells (subcells) and connecting each of the subcells to an external wire, and a monolithic tandem cell manufactured by stacking a lower cell and an upper cell on a substrate in a batch process. Thereamong, a monolithic tandem solar cell is advantageous in terms of manufacturing costs because a substrate formed between subcells, a transparent electrode material, and manufacturing processes thereof can be omitted. Furthermore, a monolithic tandem cell has an important technical merit, compared to mechanical tandem cells, because optical absorption loss due to a substrate, formed between subcells, and a transparent electrode material can be reduced. Accordingly, the monolithic tandem solar cell is considered as having superior economic and technical value compared to a mechanical tandem cell.

To realize a highly efficient monolithic tandem solar cell, it is important to form an interfacial layer, a tunnel junction layer, or a recombination layer between subcells so as not to encounter efficiency loss due to tandemization. In the case of a monolithic tandem solar cell composed of a silicon solar cell and a perovskite solar cell, the performance thereof can vary greatly depending on the combination of materials forming an interfacial layer between two subcells. In particular, when applying a silicon solar cell as a lower cell of a monolithic tandem, thin transparent electrode forms on an n-type emitter and a perovskite subcell is stacked thereon. If the properties of the thin transparent electrode are different from those of a transparent electrode substrate used to manufacture a single-junction perovskite solar cell, charge transfer or recombination between the two subcells may not be smoothly performed.

DISCLOSURE

Technical Problem

Therefore, the present invention has been made in view of the above problems, and it is an objective of the present invention to provide a monolithic solar cell, where a first solar cell, as a silicon solar cell type, and a second solar cell, as a perovskite solar cell type, are stacked in series, including an interfacial layer capable of improving charge transfer or recombination at an interface between the two subcells and a method of manufacturing the monolithic solar cell It will be understood that technical effects of the present invention are not limited to those referred below and other non-referred technical effects will be clearly understood by those skilled in the art from disclosures below.

Technical Solution

In accordance with the present invention, the above and other objectives can be accomplished by the provision of a monolithic solar cell including a first solar cell formed by sequentially stacking an electrode, a silicon substrate, and an n-type emitter layer; a junction layer (recombination layer) formed on the an n-type emitter layer; an interfacial layer formed on the junction layer; and a second solar cell including a perovskite layer and integrated onto the interfacial layer.

In an embodiment of the present invention, the interfacial layer may be a single layer constituted of poly(3,4-ethylenedioxy-thiophene) polystyrenesulfonate (PEDOT:PSS), poly(bis(4-phenyl)(2,4,6-trimethylphenyl)amine) (PTAA), polyvinyl alcohol (PVA), crosslinked N4,N4'-bis(4-(6-((3-ethyloxetan-3-yl)methoxy)hexyl)phenyl)-N4,N4'-diphenyl-biphenyl-4,4'-diamine (c-OTPD), poly(N-9'-heptadecanyl-2,7-carbazole-alt-5,5-(4',7'-di-2-thienyl-2',1',3'-benzothiadiazole) (PCDTBT), or 2,3,5,6-Tetrafluoro-7,7,8,8-tetracyanoquinodimethane (F4-TCNQ)-doped PTAA, which are based on a conductive polymer, a double layer constituted of PEDOT:PSS and poly[N, N'-bis(4-butylphenyl)-N, N'-bis(phenyl)benzidine] (poly-TPD), or a double layer constituted of PEDOT:PSS and PCDTBT.

In an embodiment of the present invention, the second solar cell may have a form wherein a p-type hole selective layer, a perovskite layer, an n-type electron selective layer, a transparent electrode layer, and a metal grid electrode layer are sequentially laminated.

In an embodiment of the present invention, a protective oxide layer may be further included between the n-type electron selective layer and the transparent electrode layer of the second solar cell. Here, the protective oxide layer may be formed of any one of zinc oxide, titanium dioxide, zirconium oxide ($ZrO_2$), aluminum-doped zinc oxide (Al-doped ZnO), tin oxide ($SnO_2$), indium oxide ($In_2O_3$), zinc tin oxide, niobium oxide ($Nb_2O_5$), barium titanate ($BaTiO_3$), strontium titanate ($SrTiO_3$), or tungsten oxide-titanium dioxide ($WO_x$—$TiO_x$) or a mixture of two or more thereof.

In an embodiment of the present invention, the perovskite layer may be formed of a composite material formed by combining two or more groups selected from the group consisting of a group of carbon compounds including a methylammonium ion ($CH_3NH_3^+$, MA ion) and a formamidinium ion ($HC(NH_2)_2^+$, FA ion), a group of metals including cesium, rubidium, lead, and tin, an iodine group, a chloride group, and a halide group.

In an embodiment of the present invention, the p-type hole selective layer may be formed of any one of $NiO_x$, $MoO_x$, $V_2O_5$, $WO_3$, and CuSCN or an oxide doped with at least one of Cu, Li, Mg, and Co.

In an embodiment of the present invention, the n-type electron selective layer may be formed of any one of PCBM and $C_{60}$ or a combination thereof and may include an organic layer formed of BCP (2,9-Dimethyl-4,7-diphenyl-1,10-phenanthroline), PFN (Poly[(9,9-bis(3'-(N,N-dimethylamino)propyl)-2,7-fluorene)-alt-2,7-(9,9-dioctylfluorene)]), LiF (Lithium fluoride), or PEIE (polyethylenimine ethoxylated).

In an embodiment of the present invention, each of the junction layer and the transparent electrode layer may be a single layer formed of an oxide of at least one of indium, tin, and zinc, any one of aluminum zinc oxide, boron zinc oxide, and hydrogenated indium oxide, or one material selected from the group consisting of oxide-based nanoparticles, silver nanowires, carbon nanotubes, graphene, and PEDOT, or a composite layer wherein two or more materials of the materials form each layer of a double layer.

In an embodiment of the present invention, the metal grid electrode layer may be formed of any one metal of silver, gold, aluminum, and nickel or an alloy of two or more thereof.

In accordance with another aspect of the present invention, there is provided a method of manufacturing a monolithic solar cell, the method including a step of forming a junction layer, which is a transparent electrode type, on a first solar cell formed by sequentially stacking an electrode, a silicon substrate, and an n-type emitter layer; an step of forming an interfacial layer on the junction layer; and a step of forming a second solar cell including a perovskite layer on the interfacial layer.

In another embodiment of the present invention, in the step of forming an interfacial layer, a heat treatment process and an ozone treatment process may be performed.

In another embodiment of the present invention, the step of forming an interfacial layer may be a step of forming a single layer, constituted of PEDOT:PSS, PTAA, c-OTPD, PCDTBT, or F4-TCNQ-doped PTAA, on the junction layer or a step of forming a double interfacial layer, constituted of PEDOT:PSS and a polymer material (e.g., poly-TPD, PCDTBT, etc.), on the junction layer.

Advantageous Effects

In accordance with the present invention, an interfacial layer is provided between two cells constituting a monolithic solar cell, thereby improving charge transfer and recombination characteristics between the two cells. Accordingly, a monolithic solar cell having significantly improved photoelectric conversion efficiency can be provided.

In addition, in accordance with the present invention, the interfacial layer, which is inserted into an interface between two cells constituting the monolithic solar cell and is constituted of an organic material, can be partially or completely pyrolyzed and thus lost during a heat treatment process. Accordingly, optical loss occurring at the interface during manufacture of the monolithic solar cell can be prevented, and electrical loss at the interface can be minimized, which allows the manufacture of a highly efficient monolithic solar cell.

Further, a method of manufacturing a monolithic solar cell according to the present invention can overcome the efficiency limit of the silicon solar cell without greatly increasing the manufacturing costs of the silicon solar cell because a perovskite cell constituting the monolithic solar cell is manufactured based on a simple solution process.

It should be understood that the effects of the present invention are not limited to the effects described above, but include all effects that can be deduced from the detailed description of the present invention or the constitution of the invention described in the claims.

MODES OF THE INVENTION

Hereinafter, the present invention will be described in detail with reference to the accompanying drawings. The present invention may, however, be embodied in many different forms and should not be construed as limited to the embodiments set forth herein. The features of the present invention will be more clearly understood from the accompanying drawings and should not be limited by the accompanying drawings, and it is to be appreciated that all changes, equivalents, and substitutes that do not depart from the spirit and technical scope of the present invention are encompassed in the present invention. To clearly explain the present invention, parts not related to the description are omitted in the drawings, and the size, form, and shape of each component shown in the drawings may be variously modified. Throughout this specification, the same or similar reference numerals are given to the same or similar parts. In the drawings, identical/like reference numerals denote identical/similar elements.

Suffixes, "cell," "step," "process," etc., for components used in the following description are given or used in combination in consideration of ease of specification writing and do not have a distinct meaning or role. In the following description of the present invention, a detailed description of known functions and configurations incorporated herein will be omitted when it may make the subject matter of the present invention unclear.

In the specification, when it is described that a certain part is "connected, contacted, coupled, stacked, or laminated" to another part, it should be understood that the certain part may be directly "connected, contacted, coupled, stacked, or laminated" to another part or indirectly "connected, contacted, coupled, stacked, or laminated" to another part via another member in the middle. In addition, when a certain part "includes (is provided with)" a certain component, this indicates that the part may further "include (be provided with)" another component instead of excluding another component unless specifically described otherwise.

It will be understood that, although the terms first, second, third etc. may be used herein to describe various elements, these elements should not be limited by these terms. These terms are only used to distinguish one element from another element. For example, a first element may be termed a second element and a second element may be termed a first element without departing from the teachings of the present invention.

The terminology used herein is for the purpose of describing particular embodiments only and is not intended to be limiting of the inventive concept. The expression of singularity in the present specification includes the expression of plurality unless clearly specified otherwise in the context. Dispersed components may be implemented in a combined form unless otherwise specified. Also, the terms such as "include" or "comprise" may be construed to denote a certain characteristic, number, step, operation, component, or a combination thereof in the specification, but may not be construed to exclude the presence of or a possibility of addition of one or more other characteristics, numbers, steps, operations, components, or combinations thereof.

Figure 1:
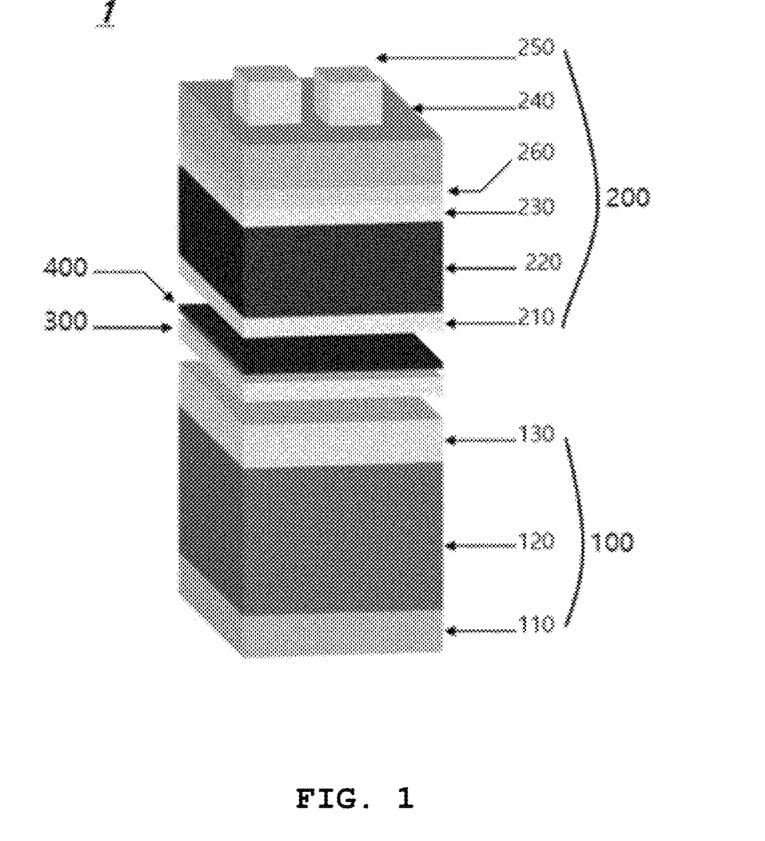
FIG. 1 is a schematic diagram illustrating the configuration of a monolithic solar cell according to an embodiment of the present invention.

FIG. 1 is a schematic diagram illustrating the configuration of a monolithic solar cell (hereinafter referred to as "monolithic solar cell 1") according to an embodiment of the present invention. The monolithic solar cell 1 includes a first solar cell 100 forming a lower part of the monolithic solar cell 1, a second solar cell 200 formed on the first solar cell 100 and forming an upper part of the monolithic solar cell 1, and a junction layer 300 (or recombination layer) and interfacial layer 400 (or sacrificial layer) formed between the first and second solar cells 100 and 200.

The first solar cell 100 is formed by sequentially stacking an electrode 110, a silicon substrate 120, and an n-type emitter layer 130 and may be a silicon solar cell excluding a front electrode.

The junction layer 300 is formed on the n-type emitter layer 130 and may be a transparent conductive layer or transparent electrode layer with transparency and conductivity. The junction layer 300 may be formed of an oxide of at least one of indium (In), tin (Sn), and zinc (Zn), e.g., indium tin oxide, indium zinc oxide, or zinc tin oxide, aluminum zinc oxide, boron zinc oxide, or hydrogenated indium oxide including aluminum, boron, or hydrogen, or may be one layer or a composite layer including two or more selected from the group consisting of oxide-based nanoparticles, silver nanowires, carbon nanotubes, graphene, and PEDOT. The junction layer 300, which is a tunnel junction layer or a recombination layer, may be a layer for tandem integration of the first solar cell 100 and the second solar cell 200.

The interfacial layer 400 may be formed on the junction layer 300 and may be a single layer constituted of conductive polymer-based PEDOT:PSS, PTAA, c-OTPD, PCDTBT, or, F4-TCNQ-doped PTAA or a double layer constituted of PEDOT:PSS and a polymer material (e.g., poly-TPD, PCDTBT, etc.), formed on the junction layer.

In other words, the interfacial layer 400 may be a single layer constituted of poly(3,4-ethylenedioxy-thiophene) polystyrenesulfonate (PEDOT:PSS), poly(bis(4-phenyl)(2, 4,6-trimethylphenyl)amine) (PTAA), polyvinyl alcohol (PVA), crosslinked N4,N4'-bis(4-(6-((3-ethyloxetan-3-yl) methoxy)hexyl)phenyl)-N4,N4'-diphenylbiphenyl-4,4'-diamine (c-OTPD), poly(N-9'-heptadecanyl-2,7-carbazole-alt-5,5-(4',7∝0-di-2-thienyl-2',1',3'-benzothiadiazole) (PCDTBT), or 2,3,5,6-Tetrafluoro-7,7,8,8-tetracyanoquinodimethane (F4-TCNQ)-doped PTAA, which are based on a conductive polymer, a double layer constituted of PEDOT: PSS and poly[N, N'-bis(4-butylphenyl)-N, N'-bis(phenyl) benzidine] (poly-TPD), or a double layer constituted of PEDOT:PSS and PCDTBT.

In addition, the interfacial layer 400 may be partially decomposed in a process of integration of the first solar cell 100 to the second solar cell 200. Accordingly, the interfacial layer 400 may be referred to as an organic sacrificial layer.

The second solar cell 200 with a perovskite included may be integrated on the interfacial layer 400 and formed in a perovskite solar cell form excluding a back electrode.

In addition, the second solar cell 200 may have a form wherein a p-type hole selective layer 210, a perovskite layer 220, an n-type electron selective layer 230, a transparent electrode layer 240, and a metal grid electrode layer 250 are sequentially laminated.

In addition, a protective oxide layer 260 formed of any one of zinc oxide, titanium dioxide, zirconium oxide ($ZrO_2$), aluminum-doped zinc oxide (Al-doped ZnO), tin oxide ($SnO_2$), indium oxide ($In_2O_3$), zinc tin oxide, niobium oxide ($Nb_2O_5$), barium titanate ($BaTiO_3$), strontium titanate ($SrTiO_3$), or tungsten oxide-titanium dioxide ($WO_x$—$TiO_x$) or a mixture of two or more thereof may be further included between the n-type electron selective layer 230 and the transparent electrode layer 240 of the second solar cell 200.

The perovskite layer 220 constituting the second solar cell 200 may be formed of a composite material formed by combining two or more groups selected from the group consisting of a group of carbon compounds including a methylammonium ion ($CH_3NH_3^+$, MA ion) and a formamidinium ion ($HC(NH_2)_2^+$, FA ion), a group of metals including cesium, rubidium, lead, and tin, an iodine group, a chloride group, and a halide group, but the present invention is not limited thereto. In addition, the perovskite layer 220 may be manufactured by a solution process, a vacuum process, or a combined process, but the present invention is not limited thereto.

In addition, the p-type hole selective layer 210 may be formed of any one of $NiO_x$, $MoO_x$, $V_2O_5$, $WO_3$, and CuSCN or an oxide doped with at least one of Cu, Li, Mg, and Co, and the n-type electron selective layer 230 may be formed of any one of PCBM and $C_{60}$ or a combination thereof, but the present invention is not limited thereto. In addition, the n-type electron selective layer 230 may include a separate organic layer formed of BCP, PFN, LiF, or PEIE.

Similar to the junction layer 300 described above, the transparent electrode layer 240 may also be formed of an oxide of at least one of indium (In), tin (Sn), and zinc (Zn), e.g., indium tin oxide, indium zinc oxide, or zinc tin oxide, aluminum zinc oxide, boron zinc oxide, or hydrogenated indium oxide including aluminum, boron, or hydrogen, or may be one layer or a composite layer including two or more selected from the group consisting of oxide-based nanoparticles, silver nanowires, carbon nanotubes, graphene, and PEDOT.

In other words, each of the junction layer 300 and the transparent electrode layer 240 may be a single layer formed of an oxide of at least one of indium, tin, and zinc, any one of aluminum zinc oxide, boron zinc oxide, and hydrogenated indium oxide, or one material selected from the group consisting of oxide-based nanoparticles, silver nanowires, carbon nanotubes, graphene, and PEDOT, or a composite layer wherein two or more materials of the materials form each layer of a double layer.

The metal grid electrode layer 250 may be formed of any one metal of silver, gold, aluminum, and nickel or an alloy of two or more thereof, or may be formed of various types of metals or alloys.

Hereinafter, effects of the monolithic solar cell 1 will be described in detail through an experimental example, in which the monolithic solar cell 1 manufactured according to an embodiment of the present invention was used, and a comparative example of the experimental example, with reference to FIGS. 2 to 7.

Experimental Example

To manufacture monolithic solar cells including an interfacial layer (organic sacrificial layer) according to various embodiments of the present invention, a first solar cell, which was a silicon solar cell type, was prepared, an ITO-type tunnel junction layer was formed on an n-type emitter of the first solar cell, a PEDOT:PSS interfacial layer (or organic sacrificial layer) was formed on the ITO-type tunnel junction layer, and a second solar cell, which was a perovskite solar cell type, was laminated on the PEDOT:PSS interfacial layer.

Here, the PEDOT:PSS interfacial layer was manufactured by diluting PEDOT:PSS (Clevios™ P VP AI 4083), manufactured by Heraeus, with methanol, and then forming a PEDOT:PSS thin-film by spin-coating, followed by heat-treatment at 150° C. for 20 minutes.

A second solar cell, which is a perovskite solar cell type, was manufactured by sequentially laminating a p-type hole-selective film, a perovskite, an n-type electron-selective film, a protective oxide layer, a transparent electrode, and a metal grid electrode from the bottom.

To produce the p-type hole-selective film, nickel nitrate hexahydrate, cupric nitrate trihydrate, and ethylenediamine were dissolved in ethylene glycol at a concentration of 1.0 M, and then a nickel oxide precursor film was formed by spin-coating, followed by oxidizing at 300° C. for 1 hour, thereby manufacturing a nickel oxide-based hole-selective film doped with 5 mol % copper.

The perovskite was manufactured by a one-step process using methylammonium iodide ($CH_3NH_3I$) and lead iodide ($PbI_2$) (methylammonium lead iodide ($CH_3NH_3PbI_3$)). Here, methylammonium lead iodide ($CH_3NH_3PbI_3$) is one of compositions of a perovskite light absorption layer and may be named $MAPbI_3$.

Each of the n-type electron-selective film and the protective oxide layer was formed by spin-coating each of PCBM and ZnO solutions, an InZnO-type transparent electrode was formed by sputter deposition, and an Ag grid electrode was deposited by a thermal evaporation method.

Figure 2:
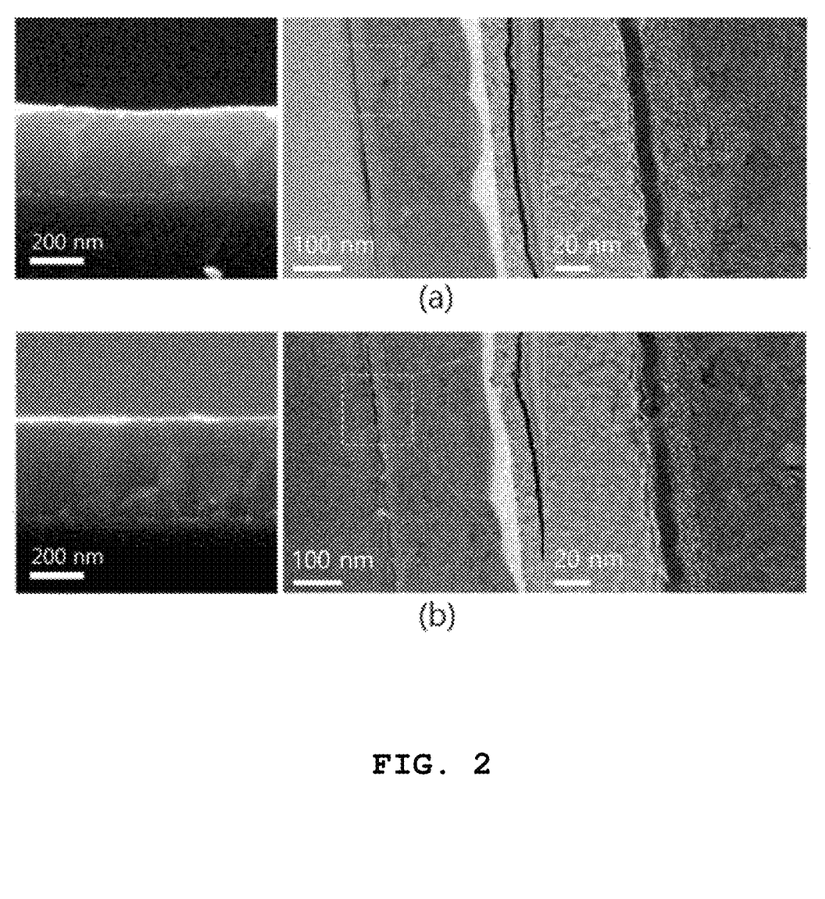
FIG. 2 is a set of scanning electron microscope images and transmission electron microscope images illustrating the structure of a monolithic solar cell including an interfacial layer according to an embodiment of the present invention and the structure of a monolithic solar cell excluding an interfacial layer.

The structure of the monolithic solar cell including the PEDOT:PSS interfacial layer was observed with a field emission scanning electron microscope (FE-SEM, Inspect F) and a transmission electron microscope (TEM, TITAN), and results thereof are illustrated in FIG. 2 (FIG. 2(a)). In addition, to analyze the PEDOT:PSS interfacial layer in detail, EDS line scan (energy dispersive X-ray spectroscopy, Talos) analysis and XPS depth profile (PHI 5000 VersaProbe) analysis were performed, and results thereof are respectively illustrated in FIGS. 3 and 4.

Figure 3:
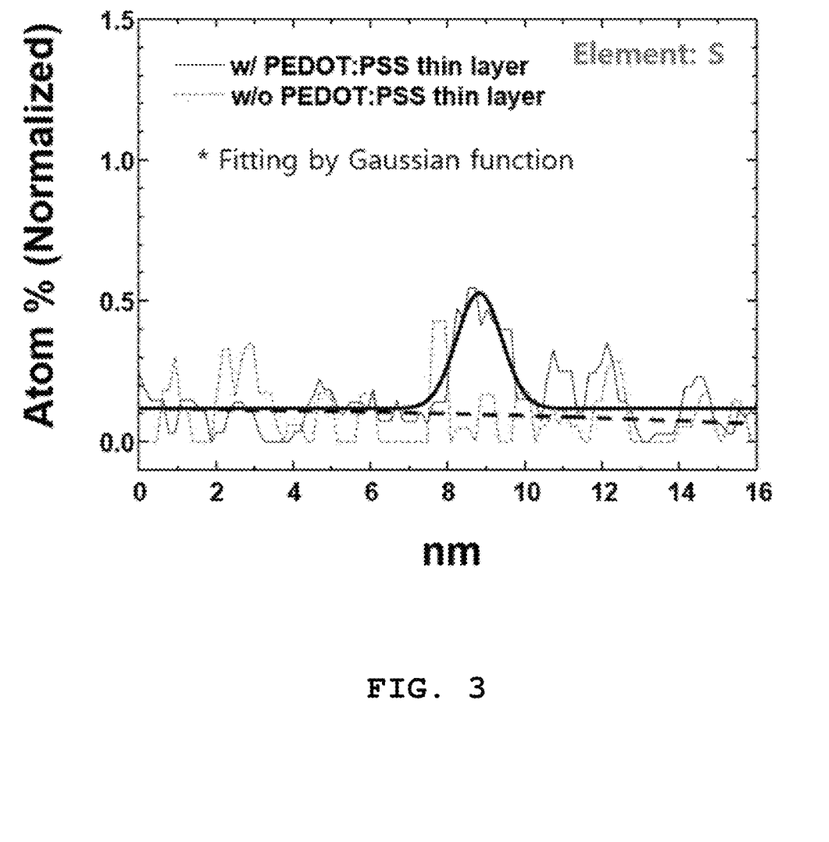
FIG. 3 illustrates results of EDS line scan for element distribution near an interface between two cells in each of the case of a monolithic solar cell including an interfacial layer according to an embodiment of the present invention and the case of a monolithic solar cell excluding an interfacial layer.
Figure 4:
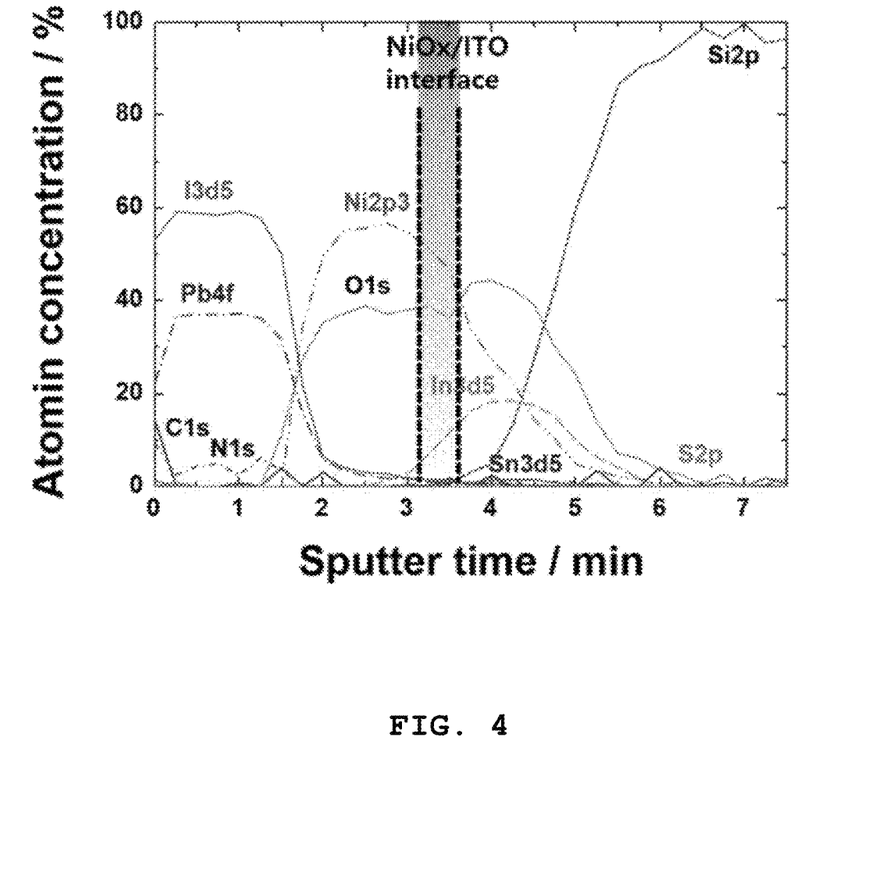
FIG. 4 illustrates results of XPS depth profile analysis for element distribution near an interface between two cells constituting a monolithic solar cell including an interfacial layer according to an embodiment of the present invention.

Referring to FIG. 3, a small amount of the sulfur (S) component contained in PEDOT:PSS was detected near the interface between the two cells constituting the monolithic solar cell including the interfacial layer. On the other hand, referring to FIG. 4, it can be confirmed that an XPS signal of PEDOT:PSS is not detected at the interface between the two cells constituting the monolithic solar cell including the interfacial layer.

From these results, it can be confirmed that the very thin PEDOT:PSS interfacial layer is partially or completely pyrolyzed and lost during the high-temperature heat treatment process to manufacture the nickel oxide-based hole-selective film, thus is a sacrificial layer.

Figure 5:
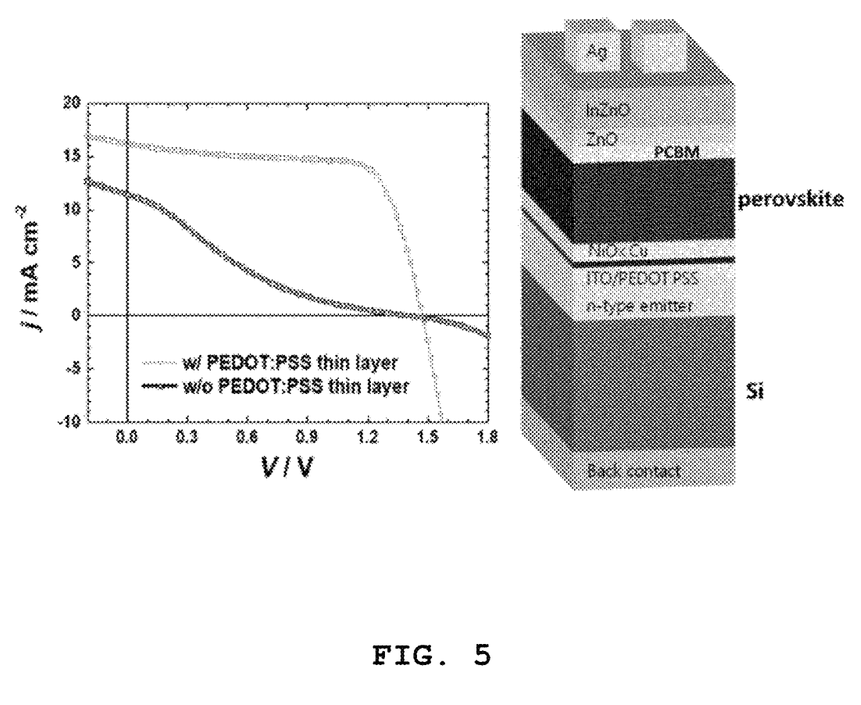
FIG. 5 illustrates a current-voltage measurement graph for a monolithic solar cell and a schematic diagram of the measured monolithic solar cell in each of the case of a monolithic solar cell including an interfacial layer according to an embodiment of the present invention and the case of a monolithic solar cell excluding an interfacial layer.

Meanwhile, referring to a current-voltage curve of each of the monolithic solar cells including or excluding the interfacial layer shown in FIG. 5, it can be confirmed that photoelectric conversion efficiency of the monolithic solar cell including the interfacial layer is significantly improved. In particular, it can be confirmed that the significant decrease in series resistance is a major factor in improving the performance of the solar cell.

As shown in the experimental example, it can be confirmed that, although the PEDOT:PSS interfacial layers according to the various embodiments of the present invention are pyrolyzed and thus partially or completely lost during a monolithic solar cell manufacturing process, the interface between the two cells constituting the monolithic solar cell exhibits significantly improved charge transfer or recombination characteristics, compared to a conventional monolithic solar cell, due to insertion of the interfacial layer (sacrificial layer). Accordingly, the present invention can provide a monolithic solar cell with dramatically improved photoelectric conversion efficiency. In addition, introduction of the appropriate interfacial layer according to the various embodiments of the present invention allows a monolithic solar cell to minimize factors causing efficiency loss that occurs at an interface or a junction between two subcells, enabling the implementation of a highly efficient monolithic solar cell.

Comparative Example 1

Second solar cells, which are single-junction perovskite solar cell types, were manufactured while excluding a first solar cell, which is a silicon solar cell, thereunder in the same manner as in the experimental example. One of the second solar cells was manufactured to include a PEDPOT:PSS interfacial layer on an ITO transparent electrode substrate, and another second solar cell was manufactured to exclude the PEDPOT:PSS interfacial layer. Schematic diagrams and current-voltage measurement results of the second solar cells are illustrated in FIG. 6.

Figure 6:
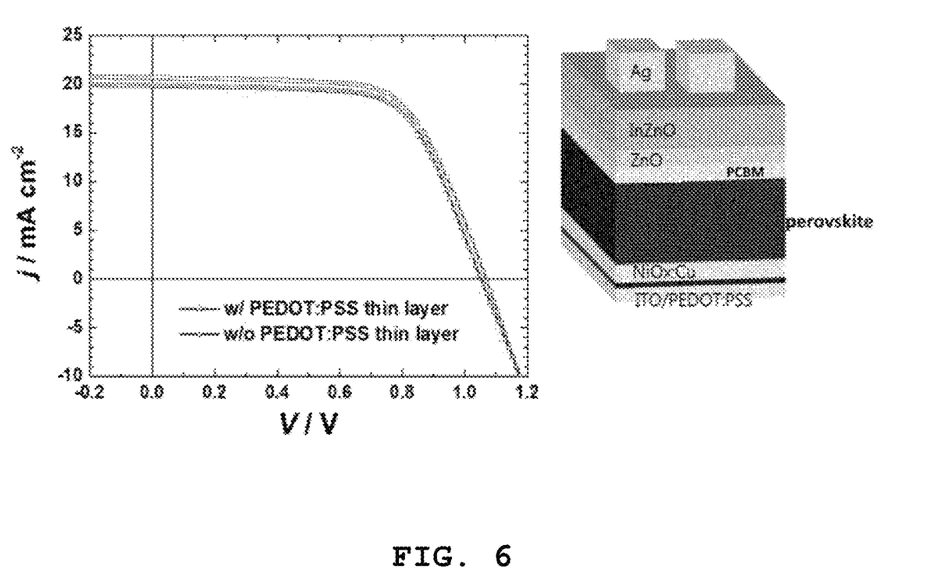
FIG. 6 illustrates a current-voltage measurement graph for a second solar cell, which is a perovskite solar cell, and a schematic diagram of the measured second solar cell in each of the case of a second solar cell including an interfacial layer according to an embodiment of the present invention and the case of a second solar cell excluding an interfacial layer.

Referring to FIG. 6, it can be confirmed that the presence of the PEDOT:PSS interfacial layer does not greatly affect the performance of the second solar cells which are single-junction perovskite solar cell types. From this, it can be confirmed that, when the properties of the ITO transparent electrode formed on the first solar cell, which is a silicon solar cell type, to manufacture a monolithic solar cell are different from the properties of the ITO transparent electrode used to manufacture the second solar cell which is a single-junction perovskite solar cell type, charge transfer or recombination between two cells constituting the monolithic solar cell may not be smoothly performed.

Comparative Example 2

A monolithic solar cell was manufactured in the same manner as in the aforementioned experimental example, except that a PEDOT:PSS interfacial layer was not inserted thereinto. The structure of the monolithic solar cell according to Comparative Example 2 was observed, and a result thereof is illustrated in FIG. 2(b).

Referring to FIG. 2(b), it can be confirmed that the presence of the PEDOT:PSS interfacial layer does not affect the structure of the upper layers, compared to the image of FIG. 2(a) illustrating the structure according to the aforementioned experimental example. Accordingly, it can be confirmed that the structural characteristics of the monolithic solar cells manufactured according to the various embodiments of the present invention are not affected by insertion of the PEDOT:PSS interfacial layer.

Figure 7:
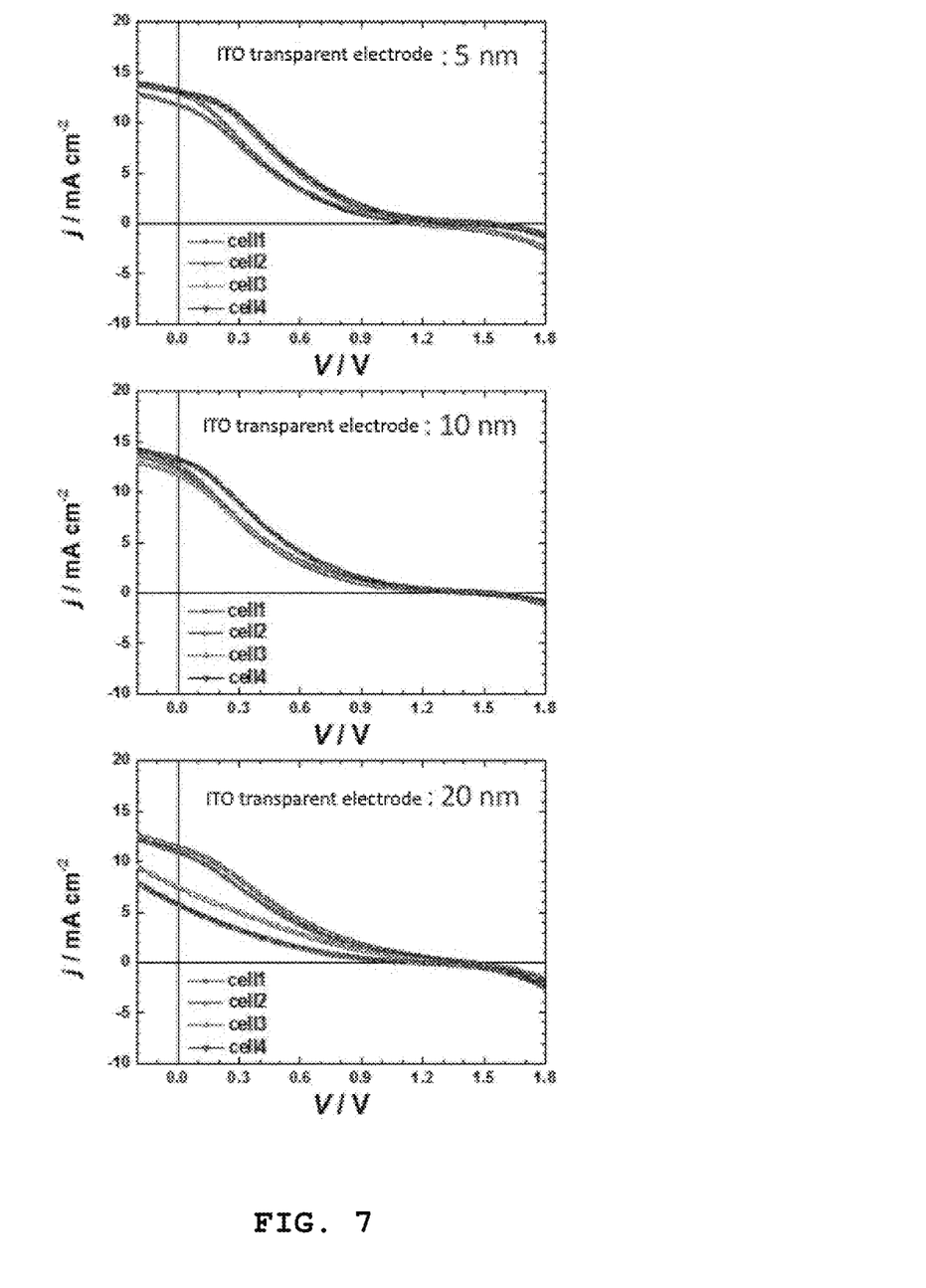
FIG. 7 illustrates current-voltage curves dependent upon a thickness change in a transparent electrode in a monolithic solar cell excluding an interfacial layer according to an embodiment of the present invention.
Figure 8:
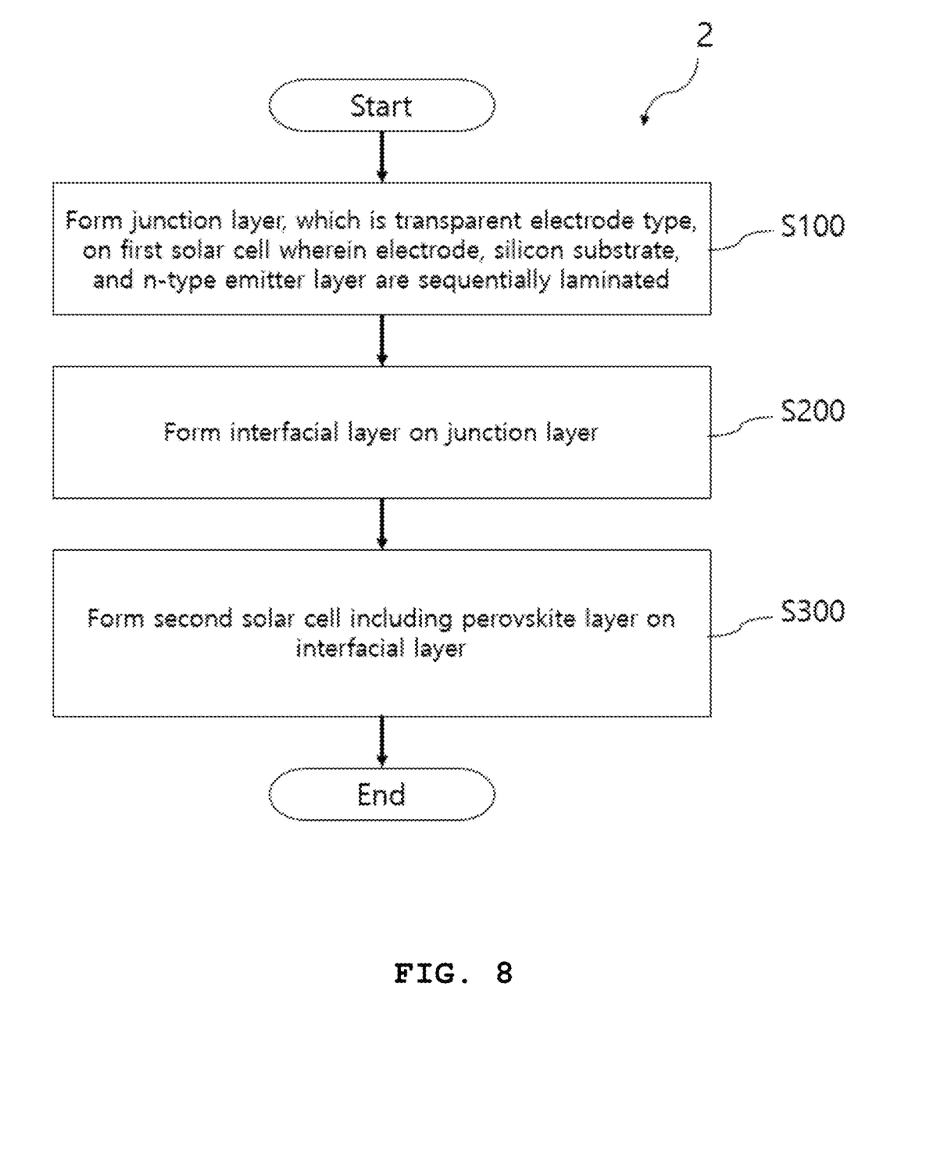
FIG. 8 is a flowchart illustrating a procedure of a method of manufacturing a monolithic solar cell according to another embodiment of the present.

Meanwhile, referring to FIG. 7 illustrating a current-voltage measurement graph of the monolithic solar cell excluding the interfacial layer manufactured according to Comparative Example 2 in the same manner as in the aforementioned experimental example, it can be confirmed that the monolithic solar cell has a high series resistance regardless of the thickness of the ITO transparent electrode formed on the first solar cell, which is a silicon solar cell type, while exhibiting a high open-circuit voltage, whereby a fill factor and photoelectric conversion efficiency thereof are significantly decreased. It can be assumed that the very high series resistance of the monolithic solar cell manufactured according to Comparative Example 2 is caused by a junction between the two cells because the monolithic solar cell manufactured according to the experimental example is the same as the monolithic solar cell manufactured according to Comparative Example 2 except for the presence/absence of the interfacial layer. FIG. 8 is a flowchart illustrating a method of manufacturing the monolithic solar cell according to another embodiment of the present invention (hereinafter referred to as "monolithic solar cell manufacturing method (2)". A monolithic solar cell (1), which has been described above with reference to FIGS. 1 to 7, may be manufactured by a monolithic solar cell manufacturing method (2) described below. Accordingly, contents overlapping with the above-mentioned contents are omitted.

The monolithic solar cell manufacturing method (2) includes a step (S100) of forming a junction layer (or recombination layer), which is a transparent electrode type, on a first solar cell formed by sequentially stacking an electrode, a silicon substrate, and an n-type emitter layer, a step (S200) of forming an interfacial layer (or sacrificial layer) on the junction layer, and a step of forming a second solar cell including a perovskite layer on the interfacial layer.

In S100, a heat treatment process and an ozone treatment process, such as a UV-ozone process, and the like may be performed.

In addition, S100 is a step of forming an single interfacial layer, constituted of PEDOT:PSS, PTAA, c-OTPD, PCDTBT, or, F4-TCNQ-doped PTAA, on the junction layer or a step of forming a double interfacial layer, constituted of PEDOT:PSS and a polymer material (e.g., poly-TPD, PCDTBT, etc.), on the junction layer.

Here, the first solar cell, the junction layer, the interfacial layer, and the second solar cell may be the same as those described above.

In addition, S100 to S300 constituting the monolithic solar cell manufacturing method (2) are not required to be necessarily performed in the order of S100, S200, and S300. The monolithic solar cell manufacturing method (2) may be performed through various procedures, and S100 to S300 may be almost simultaneously performed.

When the interfacial layer is formed and then the second solar cell is laminated according to the various embodiments of the present invention, the interfacial layer is partially or completely pyrolyzed and removed by the heat treatment step of the manufacturing processes of the second solar cell. However, an interface between two cells constituting the monolithic solar cell that includes a sacrificial layer, such as the interfacial layer, formed on the first solar cell and the second solar cell integrated to the sacrificial layer manufactured according to the various embodiments of the present invention in this manner can exhibit considerably improved charge transfer or recombination characteristics, compared to that of the monolithic solar cell excluding the interfacial layer. Accordingly, a tandem-type monolithic solar cell having dramatically improved photoelectric conversion efficiency can be manufactured.

The aforementioned description of the present invention is provided by way of example and those skilled in the art will understand that the present invention can be easily changed or modified into other specified forms without change or modification of the technical spirit or essential characteristics of the present invention. Therefore, it should be understood that the aforementioned examples are only provided by way of example and not provided to limit the present invention. It should be understood that the scope of the present invention is defined by the following claims and the invention is to cover all modifications, equivalents, and alternatives falling within the spirit and scope of the invention as defined by the claims.

MODE FOR CARRYING OUT THE INVENTION

Embodiments for carrying out the invention are described together in the best mode for carrying out the invention.

INDUSTRIAL APPLICABILITY

The present invention relates to a monolithic solar cell and a method of manufacturing the same. The monolithic solar cell and the method according to the present invention can be applied to a solar cell manufacturing technology and repetitively performed, thus having industrial applicability.

It will be apparent to those skilled in the art that various modifications can be made to the above-described exemplary embodiments of the present invention without departing from the spirit or scope of the invention. Thus, it is intended that the present invention covers all such modifications provided that they come within the scope of the appended claims and their equivalents.

What is claimed is:

1. A monolithic solar cell, comprising:
a first solar cell that is a sequential stack, in the order recited, of an electrode, a silicon substrate, and an n-type emitter layer;
a recombination layer disposed on the n-type emitter layer;
an interfacial layer that is a double layer constituted of PEDOT:PSS and poly-TPD or PEDOT:PSS and PCDTBT, and that is disposed on the recombination layer; and
a second solar cell that comprises a p-type hole selective layer and a perovskite layer disposed on the p-type hole selective layer, the p-type hole selective layer contacting and being integrated onto the interfacial layer in a heat treatment during which the interfacial layer is partially decomposed,
wherein the presence of the interfacial layer prevents a reduction in photoelectric conversion efficiency that occurs if the first solar cell and the second solar cell are combined without the presence of the interfacial layer; and
wherein the second solar cell is a sequential stack, in the order recited, of the p-type hole selective layer, the perovskite layer, an n-type electron selective layer, a transparent electrode layer, and a metal grid electrode layer; and
wherein the second solar cell further comprises a protective oxide layer that is disposed between the n-type electron selective layer and the transparent electrode layer and is composed of zinc oxide, titanium dioxide, zirconium oxide, aluminum-doped zinc oxide, tin oxide, indium oxide, zinc tin oxide, niobium oxide, barium titanate, strontium titanate, tungsten oxide-titanium dioxide, or a mixture of two or more thereof.

2. The monolithic solar cell according to claim 1, wherein the perovskite layer is a composite material comprising groups selected from the group consisting of a group of carbon compounds comprising a methylammonium ion ($CH_3NH_3^+$, MA ion) and a formamidinium ion ($HC(NH_2)_2^+$, FA ion), a group of metals comprising cesium, rubidium, lead, and tin, an iodine group, a chloride group, a halide group, and combinations thereof, and is manufactured by a solution process, a vacuum process, or a combined process.

3. The monolithic solar cell according to claim 1, wherein the p-type hole selective layer comprises $NiO_x$, $MoO_x$, $V_2O_5$, $WO_3$, CuSCN or an oxide doped with at least one of Cu, Li, Mg, and Co.

4. The monolithic solar cell according to claim 1, wherein the n-type electron selective layer comprises PCBM, $C_{60}$, or a combination thereof and comprises an organic layer composed of BCP, PFN, LiF, or PEIE.

5. The monolithic solar cell according to claim 1,
wherein each of the recombination layer and the transparent electrode layer is a single layer comprising a material that is an oxide of indium, tin, zinc, and combinations thereof, aluminum zinc oxide, boron zinc oxide, or hydrogenated indium oxide, or that is selected from the group consisting of oxide-based nanoparticles, silver nanowires, carbon nanotubes, graphene, and PEDOT, or wherein each of the recombination layer and the transparent electrode layer is a composite layer wherein two or more materials of the materials form each layer of a double layer.

6. The monolithic solar cell according to claim 1, wherein the metal grid electrode layer comprises a metal selected from the group consisting of silver, gold, aluminum, and nickel or an alloy of two or more thereof.

\* \* \* \* \*